United States Patent
Gorman et al.

(10) Patent No.: US 6,316,968 B1
(45) Date of Patent: Nov. 13, 2001

(54) SENSE AMPLIFIER CIRCUIT

(75) Inventors: Alistair Gorman, East Kilbride; Walter Ewart Gray, South Lanarkshire, both of (GB)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/355,596

(22) PCT Filed: Dec. 23, 1997

(86) PCT No.: PCT/EP97/07294

§ 371 Date: Oct. 19, 1999

§ 102(e) Date: Oct. 19, 1999

(87) PCT Pub. No.: WO98/34232

PCT Pub. Date: Aug. 6, 1998

(30) Foreign Application Priority Data

Jan. 30, 1997 (GB) .................................................. 9701858

(51) Int. Cl.[7] ........................................................ G11C 7/06

(52) U.S. Cl. ................................................. 327/53; 327/57

(58) Field of Search .................................. 327/51–57, 77; 330/288; 323/315

(56) References Cited

U.S. PATENT DOCUMENTS

| 5,773,997 | * | 6/1998 | Stiegler ................................. 327/53 |
| 5,886,546 | * | 3/1999 | Hwang ................................. 327/53 |
| 6,087,859 | * | 7/2000 | Lee et al. .............................. 327/53 |

* cited by examiner

*Primary Examiner*—Toan Tran
(74) *Attorney, Agent, or Firm*—Lanny L. Parker

(57) ABSTRACT

A sense amplifier circuit (10) utilizes two current mirror amplifiers (11, 12) to determine the state of the memory cell. Multiple current mirrors are used in order to determine which of four possible states are stored in the memory. A reference circuit (38, 41, 43) uses the same transistor structure that is in the memory to improve the operational reliability.

6 Claims, 4 Drawing Sheets

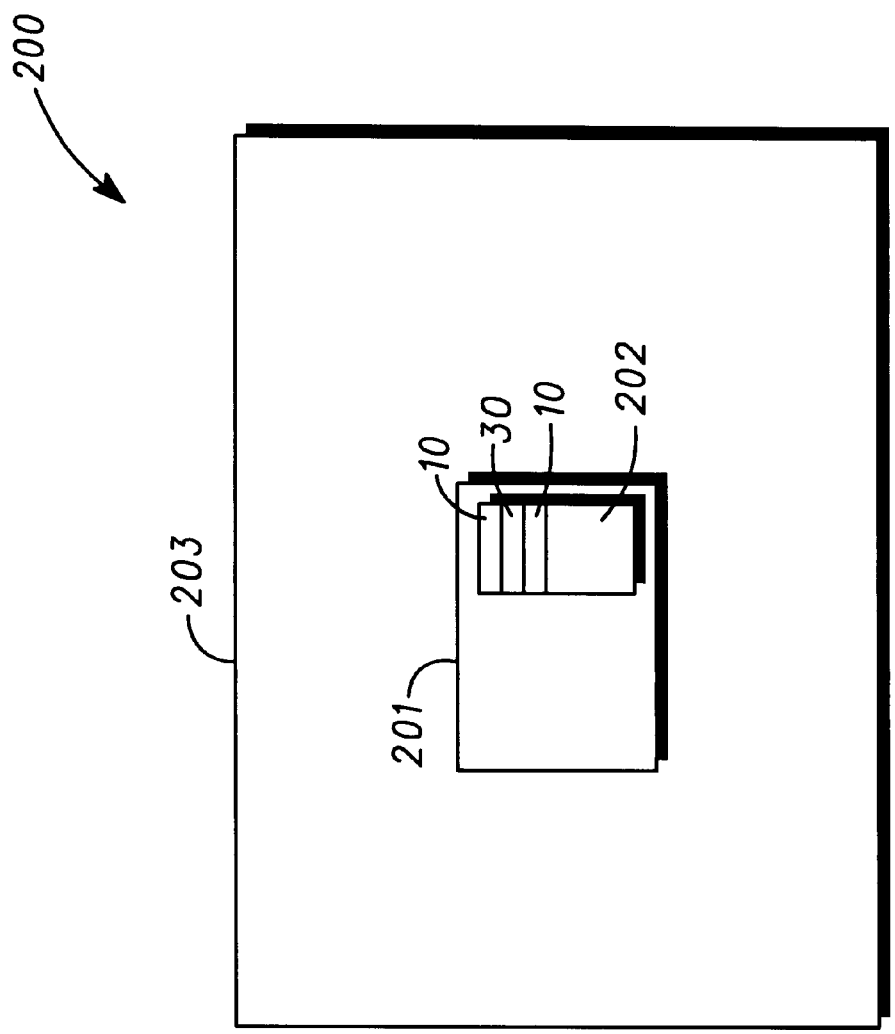

US 6,316,968 B1

SENSE AMPLIFIER CIRCUIT

BACKGROUND OF THE INVENTION

The present invention relates, in general, to semiconductor devices, and more particularly to a sense circuit suitable for use in semiconductor devices.

In the past, the semiconductor industry has utilized a variety of circuits and techniques for sensing the state of information stored in memories and other types of semiconductor devices. Typically, such circuits utilized one of two sates to store information within each cell of the memory. For large size memory erase, utilizing memory cells that store only two states results in the memory array occupying a large amount of semiconductor area thereby resulting in high semiconductor costs.

Also, the prior circuits generally utilize voltage sensing amplifiers that sense the voltage value of information in each cell of the memory array. When the memory cell read, it takes along time for the voltage to charge capacitance's coupled to the memory cell thereby requiring a long read cycle for the memory array.

Accordingly, it is desirable to have a sense circuit that consumes a small semiconductor area, that can sense more than two states that are stored within a memory cell, and that results in a fast read cycle for the memory array or memory cells.

BRIEF DESCRIPTION OF THE DRAWINGS

FIG. 4 schematically illustrates a smart card utilizing the circuit of FIG. 1 in accordance with the present invention.

DETAILED DESCRIPTION OF THE DRAWINGS

Figure 1:
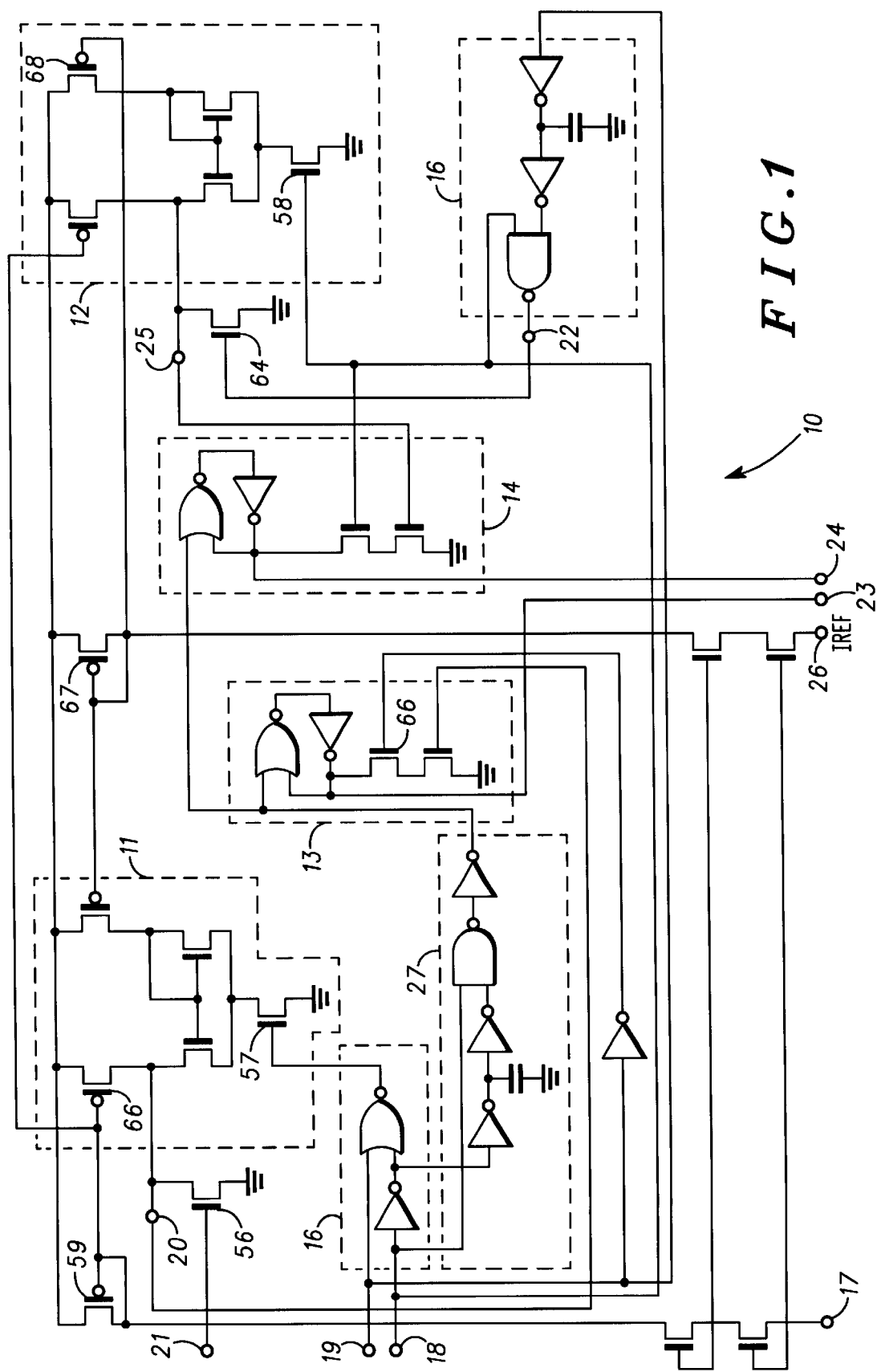
FIG. 1 schematically illustrates a sense circuit in accordance with the present invention.

FIG. 1 schematically illustrates a sense circuit 10 that is suitable for use with memory cells or memory arrays the stores multiple states within each cell [not shown]. The memory cell associated with circuit 10 typically utilizes one erase state and three programmed states in order to store four different states within each memory cell.

Circuit 10 includes a first or most significant current sense amplifier 11 and an associated most significant or first output latch 13 that provides a digital signal on a most significant or first output 23 it represents the state detected by amplifier 11 circuit 10 also includes a lease significant or second current sense amplifier 12 and associated least significant or second output latch 14 that has a least significant or second output 24 that stores a digital value representing the state detected by amplifier 12.

An output cell or portion of a memory array [not shown] is connected to a current signal input 17 of circuit 10. The current signal applied to input 17 has one of four different values of current depending on the state stored within the memory cell or memory array. The value of this current is detected and decoded by circuit 10 which provides two digital outputs comprising a most significant output bit 23 and a least significant output bit 24 that represent the four digital states stored in the memory cell. A read cycle for a cell within the memory array is composed of four phases. The first phase or bit line precharge phase during which amplifiers 11 and 12 are disabled and the signal current is applied to input 17 so that amplifiers 11 and 12 may settle, MSB evaluation phase in which amplifier 11 and latch 13 are enabled to operate, and LSB evaluation phase in which amplifier 11 is disabled and the state of latch 13 is frozen while amplifier 12 and latch 14 are unable to operate, followed by a discharge phase in which the bit line connected to input 17 is discharged.

During the phase one bit line precharge phase a most significant sense output 20 is held low in order to prevent affecting latch 13 by a most significant pulldown transistor 56 which is enabled by a most significant sense output disabled signal 21. Additionally, a sense amp enable 18 is held high in order to disable sense amp 12 and to facilitate disabling sense amp 11. Because a next bit control 19 is low, transistor 57 is disabled thereby disabling amplifier 11. Signal 18 disables transistor 58 thereby disabling amplifier 12. As enabled 18 goes to a high state, present circuit 27 generates a pulse that presets latches 13 and 14 to a high state so that a most significant output bit 23 and a least significant output bit 24 each have a high state.

During the evaluate MSB of the read cycle a most significant sense output disable 21 becomes low disabling transistor 56 thereby providing an output signal from amplifier 11 on output 20 and presenting the value of output 20 to latch 13 thereby ensuring that output bit 23 of latch 13 represents the state of output 20.

In order to determine which of the four voltage states is stored in the bit cell, the value of the current applied to input 17 is compared to three different reference current values which are applied to reference current input 26. During the evaluate MSB phase of the read cycle value applied to input 17 is compared to a first reference current value. If the value of the current applied to input 17 is greater than the first reference current value [i.e. output bit 23 is high] a second current value that is greater than the first current value will be applied to input 26 during the evaluate LSB phase in order to determine the state of output bit 24. However, if the value of the signal applied to input 17 is less than the first reference current, a third reference current value that is less than the first reference current value will be applied to input 26 in order to determine the state of bit 24. During the read cycle, the value of the current applied to output 17 is applied to amplifier 11 by transistor 59 and mirrored to amplifier 12 by transistors 59 and 66 which function as a current mirror. Additionally, the value of the reference current applied to input 26 is applied to amplifier 11 by transistor 67 and mirrored to amplifier 12 by transistor 67 and 68.

During the evaluate LSB phase of the read cycle next bit control 19 goes high which disables amplifier 11 by disabling transistor 57, freezes the state of latch 3 by disabling transistor 66, and releases output 25 of amplifier 12 by disabling transistor 64 through delayed circuit 16 as will be seen hereinafter, either a second reference current value or a third reference current value is applied to input 26, and coupled to amplifier 12 in order to determined the state of output bit 24. If the value of the current applied to input 17 is greater than the value of the referenced current applied to input 26, output 25 of amplifier 12 goes high thereby causing output 24 to go low. However, if the value of the current applied to input 17 is less than the value of the referenced current applied to input 26, then output 25 goes high and latch 14 remains preset so that output 24 also stays high. Consequently, the digital state of outputs 23 and 24 represent one of the four voltage value states that were stored on the bit cell.

Thereafter, control 19 and disable 21 both go low thereby beginning a fourth phase of the read cycle which is used to discharge a bit line [not shown] and ending the four phases of the read cycle utilized to read or determine the value of the voltage stored on the bit cell of a memory array.

Figure 2:
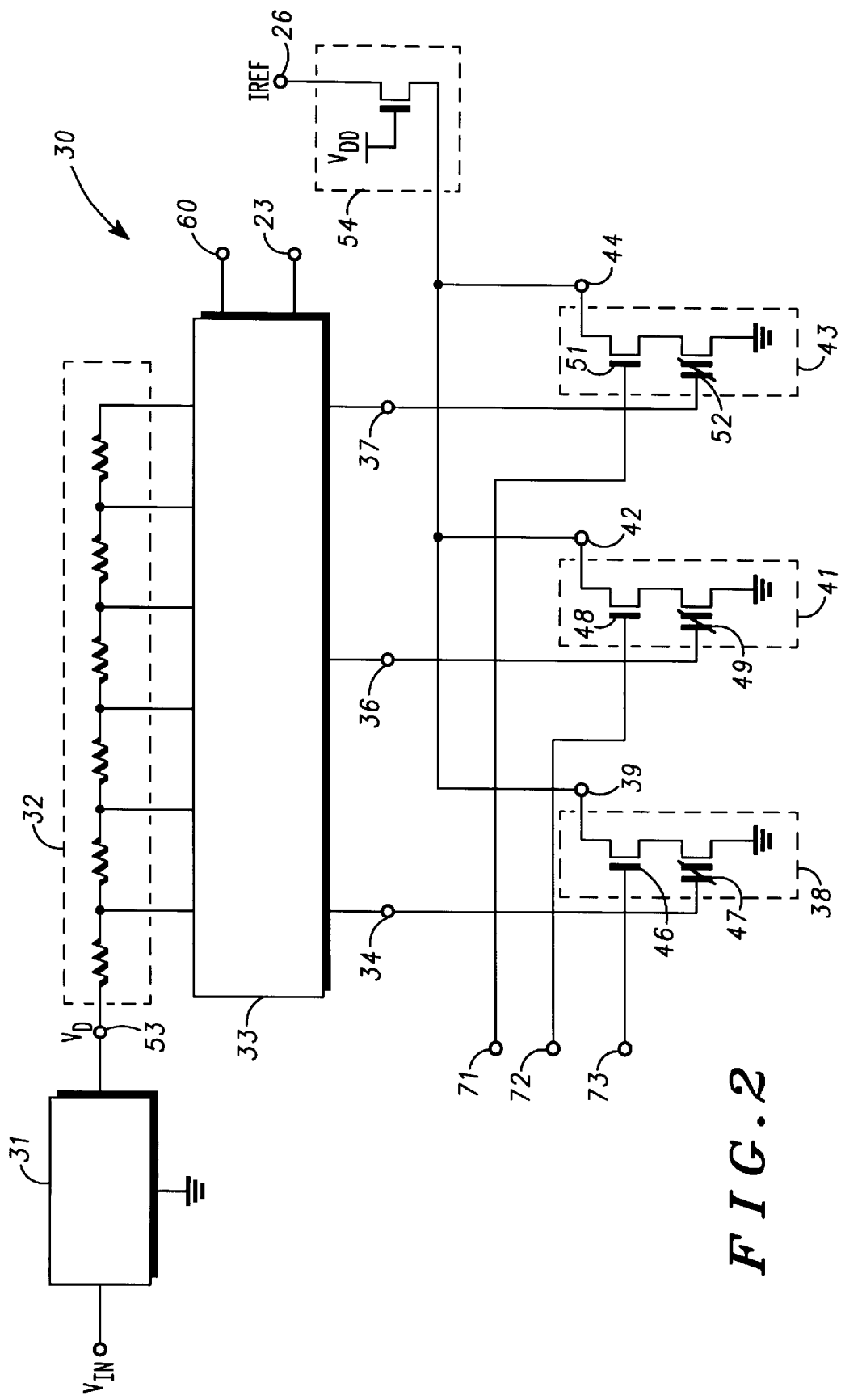
FIG. 2 schematically illustrates a reference circuit for the circuit of FIG. 1 in accordance with the present invention.

FIG. 2 schematically illustrates a reference current circuit utilized to provide one of three reference current values to input 26 of circuit 10 shown in FIG. 1. Similar elements within FIG. 2 and FIG. 1 have the same reference numbers. Reference current circuit 30 has a voltage input [Vin] that is applied to a voltage supply circuit 31, [for example a zenor diode]. Circuit 31 has a output 53 that is applied to a high precision voltage divider 32. As will be seen hereinafter, divider 32 has six resistors which divide the voltage applied to input 53 and provides six reference voltages to high voltage multiplexer 33. Multiplexer 33 has a read control input 59 that selects three read reference voltages from the six voltages provided by divider 32. The value of most significant output bit 23 is also applied to multiplexer 33 in order to determine which of the three currents should be applied to outputs 34, 36 and 37 of multiplexer 33.

Divider 32 converts the voltage applied to input 53 from a voltage value to six current values that are applied to multiplexer 33.

The first output current is applied to output 36 and to the gate of a transistor 49 which is part of a select circuit 41 that is utilized to select the first referenced current that is applied to input 26. Output 36 is coupled to the gate of transistor 49. Transistor 49 has a double poly-silicon layer gate and is constructed in the same manner as the storage transistor utilized in the storage cell of the memory array. Both poly-layers of transistor 49 are shorted together so that transistor 49 functions as a normal ordinary transistor. Because transistor 49 is constructed in a manner similar to the storage cell transistor, the reference current applied to output 42 of select circuit 41 tracks the signal current provided by the cells so that process variations do not affect the accuracy of circuit 10. Transistor 49 has a source coupled to ground or a voltage return and a drain coupled to a source of a select transistor 48. A gate of transistor 48 is coupled to a first reference control input 72, and a drain is connected to an output 42 of circuit 41 which is coupled to input 26 via a matching load transistor 54. The second reference current supplied by multiplexer 33 is applied to a transistor 47 and is similar to transistor 49. Transistor 47 is part of a referenced cell 38 that is similar to reference cell 41. Cell 38 has a select transistor 46 having a gate that is coupled to second reference control input 73 that is used to select the second referenced current to input 26. A third referenced cell 43 has a compensation transistor 52 that has a gate connected to output 37 of multiplexer 33 in order to receive the third reference current. Transistor 52 is constructed and functions similarly to transistor 49. Cell 43 also has a select transistor 51 that has a gate coupled to a third control input 71 that functions to select the third reference current coupled to input 26.

Figure 3:
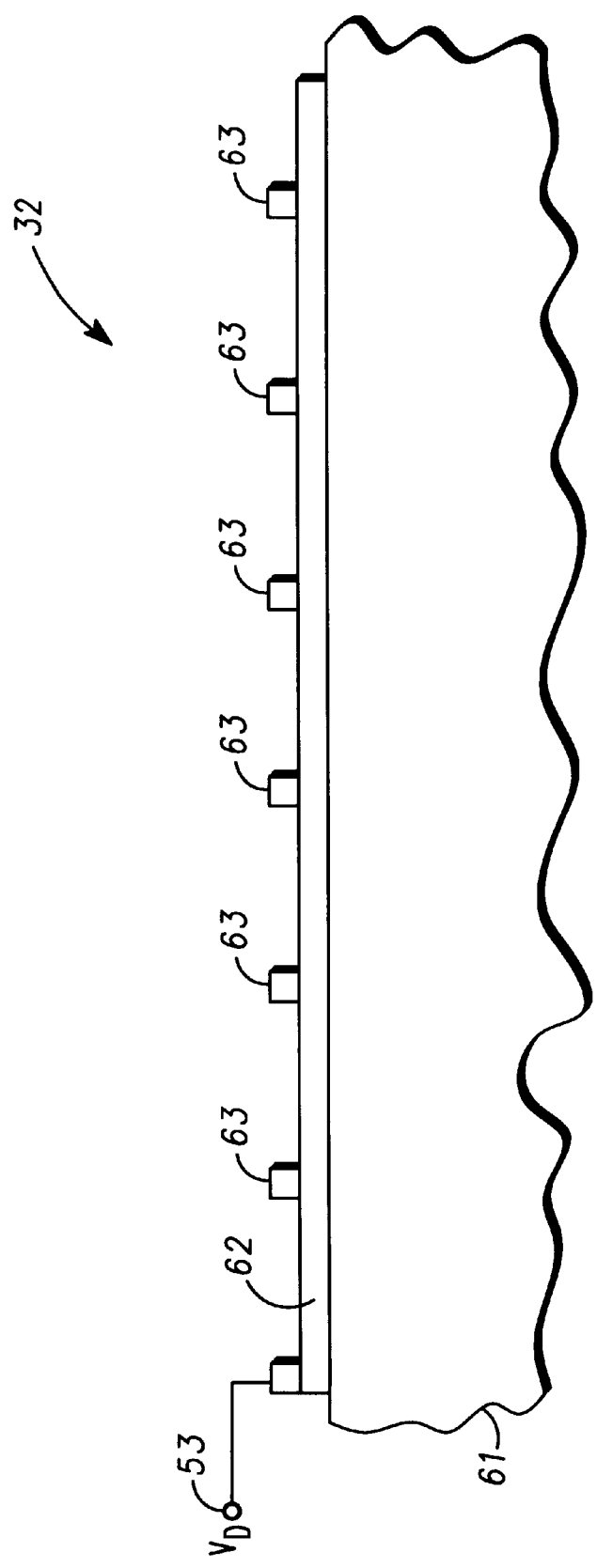
FIG. 3 is an enlarged cross-sectional portion of the circuit of FIG. 2 in accordance with the present invention.

FIG. 3 illustrates an enlarged cross-sectional portion of voltage divider 32 shown in FIG. 2. Similar elements are indicated by the same reference numbers. Divider 32 is formed on a substrate 61 and includes a layer of poly-silicon 62 that is formed on substrate 61. One end of layer 62 is connected to input 53. Periodically spaced thereafter are taps or electrical connection points 63 that are spaced at the same interval in order to create six resistors of equal value. Thus, divider 32 is a strain of poly-silicon with taps spaced along the poly-silicon string. Poly-silicon is utilized for the resistors because poly-silicon is very stable with temperature which helps ensure that the reference currents provided by divider 32 are very stable with temperature. Additionally, poly-silicon has a high resistance so that divider 32 minimizes the amount of current and power dissipated by divider 32.

FIG. 4 illustrates a smart card or personal data carrier that utilizes circuit 10 and circuit 30. Carrier 200 includes a carrier envelope, such as plastic 203 which encapsulates a control element 201, for example a micro-computer unit. Control unit 201 typically has a memory array 202 which is coupled to circuit 10 which in turn utilizes circuit 30. Because of the advantages provided by circuits 10 and 30, unit 201 utilizes a small area and provides rapid operation which increases the carrier 200 maybe utilized.

By now it should be apparent that there has been provided a novel sense circuit. Utilizing current sense amplifiers increases the operating frequency and reduces the access time and cycle time throughout the memory that is coupled to the sense circuit. Utilizing a four phase read cycle facilitates using multiple comparisons to determine the four digital states that may be stored in the memory cell. Storing four states within one memory cell reduces the amount of silicon and reduces the cost of the memory and control unit that utilizes the memory array. Forming reference current selection transistors to have the same structure as the memory cell transistors ensures that the reference current tracks the signal current thereby increasing the reliability of the memory array. Utilizing poly-silicon resistors to form multiple reference currents assists in ensuring that the reference current tracks the signal current over temperature thereby further increasing the reliability of the memory circuit.

What is claimed is:

1. A sense circuit comprising:
   a first current mirror coupled to receive a signal current and a reference current, the first current mirror having a first output;
   a first output latch coupled to receive the first output, the first output latch having a first digital output;
   a second current mirror coupled to receive the signal current and the reference current, the second current mirror having a second output wherein the first current mirror is disabled during a portion of time that the second current mirror is enabled; and
   a second output latch coupled to receive the second output, the second output latch having a second digital output.

2. The sense circuit of claim 1 further including a reference current circuit having three reference current outputs wherein a first reference current output is coupled to the first current mirror by a first select circuit and the second current mirror is coupled to one of a second reference current output by a second select circuit or a third reference current output by a third select circuit.

3. The sense circuit of claim 2 wherein the first, second, and third select circuits each include a polysilicon transistor having a gate that utilizes a poly 1 layer.

4. The sense circuit of claim 2 wherein the value of the first digital output determines whether the second or third reference current output is coupled to the second current mirror.

5. The sense circuit of a claim 1 wherein an output value of the second digital output is frozen during a time that an output value of the first digital output is enabled and the output value of the first digital output is frozen during a time that the output value of the second digital output is enabled.

6. The sense circuit of claim 1 wherein the sense circuit is included in a portable data carrier.

* * * * *